US010923676B2

(12) United States Patent
Wu et al.

(10) Patent No.: US 10,923,676 B2
(45) Date of Patent: Feb. 16, 2021

(54) ENCAPSULATING STRUCTURE OF ORGANIC LIGHT EMITTING DIODE DISPLAY PANEL HAVING CONCAVE-CONVEX STRUCTURE IN ENCAPSULATING PORTION

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Shouzheng Wu, Beijing (CN); Qing Zhang, Beijing (CN); Fusheng Huang, Beijing (CN); Ji Shao, Beijing (CN); Dapeng Liu, Beijing (CN); Zhigang Ouyang, Beijing (CN); Xiaojun Wang, Beijing (CN); Jun Xu, Beijing (CN); Baoqing Yin, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 16/338,661

(22) PCT Filed: May 25, 2018

(86) PCT No.: PCT/CN2018/088420
§ 371 (c)(1),
(2) Date: Apr. 1, 2019

(87) PCT Pub. No.: WO2018/214962
PCT Pub. Date: Nov. 29, 2018

(65) Prior Publication Data
US 2020/0044185 A1 Feb. 6, 2020

(30) Foreign Application Priority Data
May 25, 2017 (CN) .......................... 2017 1 0379608

(51) Int. Cl.
*H01L 51/52* (2006.01)
*H01L 51/56* (2006.01)
*H01L 27/32* (2006.01)

(52) U.S. Cl.
CPC .......... *H01L 51/5243* (2013.01); *H01L 27/32* (2013.01); *H01L 51/5246* (2013.01); *H01L 51/5253* (2013.01); *H01L 51/56* (2013.01)

(58) Field of Classification Search
CPC . H01L 27/32; H01L 51/5246; H01L 51/5253; H01L 51/56; H01L 51/5243
See application file for complete search history.

(56) References Cited

U.S. PATENT DOCUMENTS

2006/0135029 A1  6/2006  Harada
2007/0172971 A1  7/2007  Boroson
(Continued)

FOREIGN PATENT DOCUMENTS

CN  101477997 A  7/2009
CN  103426896 A  12/2013
(Continued)

OTHER PUBLICATIONS

International Search Report and Written Opinion issued in corresponding application PCT/CN2018/088420, dated Aug. 28, 2018, with English translation.
(Continued)

*Primary Examiner* — Michael Jung
(74) *Attorney, Agent, or Firm* — McDermott Will and Emery LLP (57) ABSTRACT

A package structure of an organic light emitting diode display panel includes a display substrate, a glass cover plate and a package portion. The display substrate and the glass cover are arranged opposite to each other. The package portion is provided between a non-display region of the
(Continued)

display substrate and a portion of the glass cover plate corresponding to the non-display region. The display substrate includes organic light emitting diode elements. The organic light emitting diode elements are located in a sealed cavity enclosed by the display substrate, the glass cover plate and the package portion. The package portion includes a first concavo-convex structure provided at a surface of the display substrate facing the glass cover plate; a second concavo-convex structure provided at a surface of the glass cover plate close to the display substrate; and a package material is provided between the first concavo-convex structure and the second concavo-convex structure.

16 Claims, 3 Drawing Sheets

(56) References Cited

U.S. PATENT DOCUMENTS

| | | | |
|---|---|---|---|
| 2009/0167132 A1 | 7/2009 | Bae et al. | |
| 2013/0011598 A1* | 1/2013 | Kawanami | C03C 8/18 428/76 |
| 2014/0062290 A1 | 3/2014 | Kim | |
| 2015/0349288 A1 | 12/2015 | Luo et al. | |
| 2017/0133626 A1* | 5/2017 | Senoo | H01L 51/5203 |
| 2017/0194397 A1* | 7/2017 | Kim | H01L 27/3251 |
| 2018/0226604 A1 | 8/2018 | Gong et al. | |
| 2018/0261800 A1 | 9/2018 | Hara et al. | |

FOREIGN PATENT DOCUMENTS

| | | |
|---|---|---|
| CN | 103682143 A | 3/2014 |
| CN | 104037196 A | 9/2014 |
| CN | 106025092 A | 10/2016 |
| CN | 107104201 A | 8/2017 |
| TW | 201622973 A | 7/2016 |
| WO | 2014003196 A1 | 1/2014 |

OTHER PUBLICATIONS

First Office Action issued in corresponding Chinese Patent Application No. 201710379608.3, dated May 9, 2018, with English translation.

Second Office Action issued in corresponding Chinese Patent Application No. 201710379608.3, dated Dec. 28, 2018, with English translation.

Third Office Action issued in corresponding Chinese Patent Application No. 201710379608.3, dated Apr. 18, 2019, with English translation.

* cited by examiner

ENCAPSULATING STRUCTURE OF ORGANIC LIGHT EMITTING DIODE DISPLAY PANEL HAVING CONCAVE-CONVEX STRUCTURE IN ENCAPSULATING PORTION

CROSS-REFERENCE OF RELATED APPLICATIONS

This application is a national phase entry under 35 U.S.C. § 371 of International Patent Application No. PCT/CN2018/088420, filed on May 25, 2018, which claims priority to Chinese Patent Application No. 201710379608.3, submitted to Chinese Patent Office on May 25, 2017, titled "AN ENCAPSULATING STRUCTURE OF ORGANIC LIGHT EMITTING DIODE DISPLAY PANEL AND METHOD OF MANUFACTURING THE SAME, DISPLAY DEVICE", which are incorporated herein by reference in their entirety.

TECHNICAL FIELD

The present disclosure relates to the field of display technologies, and in particular, to an encapsulating structure of an organic light emitting diode display panel and a method of manufacturing the same, a display device.

BACKGROUND

Organic light emitting diode (referred briefly to as OLED) elements are widely used in the display industry due to their high brightness, full viewing angle, fast response, flexible display and the like. However, since the OLED elements are very sensitive to water, oxygen, and the like in the air, and thus, water, oxygen and the like which permeate into interiors of the OLED elements seriously affect the service life of the organic light emitting diode elements. Therefore, there is a need that the OLED elements are encapsulated by using an encapsulating structure of an OLED display panel, so as to prevent water, oxygen, etc. from entering the interiors of the OLED elements by using the encapsulating structure of the OLED display panel.

SUMMARY

Some embodiments of the present disclosure provide an encapsulating structure of an OLED display panel, the encapsulating structure of the OLED display panel includes a display substrate and a glass cover plate opposite to each other, and an encapsulating portion disposed between a non-display area of the display substrate and a portion of the glass cover plate which is corresponding to the non-display area, wherein the display substrate includes OLED elements, the OLED elements are located in a sealed chamber surrounded by the display substrate, the glass cover plate, and the encapsulating portion;

the encapsulating portion includes:

a first concavo-convex structure disposed on a surface of the display substrate which faces the glass cover plate;

a second concavo-convex structure disposed on a surface of the glass cover plate which faces the display substrate; and an encapsulant material disposed between the first concavo-convex structure and the second concavo-convex structure.

In some embodiments, a dark matrix layer is disposed on the surface of the glass cover plate which faces the display substrate, and the second concavo-convex structure and the dark matrix layer are disposed in a same layer.

In some embodiments, a cross-sectional shape of the first concavo-convex structure is saw-toothed in a direction perpendicular to a plate surface of the display substrate; and/or a cross-sectional shape of the second concavo-convex structure is saw-toothed in a direction perpendicular to a plate surface of the glass cover plate.

In some embodiments, an orthographic projection of the first concavo-convex structure on the glass cover plate and an orthographic projection of the second concavo-convex structure on the glass cover are at least partially overlapped.

In some embodiments, the encapsulating portion further includes a first dense layer disposed between the first concavo-convex structure and the encapsulant material, and a second dense layer disposed between the second concavo-convex structure and the encapsulant material.

In some embodiments, the encapsulating portion further includes a sealing layer disposed on a surface of the encapsulant material which is away from the sealed chamber and configured to seal the encapsulant material, a surface of the sealing layer is connected to the first dense layer, and an opposite surface of the sealing layer is connected to the second dense layer.

In some embodiments, the encapsulating portion further includes:

a first planar extension portion connected to an end of the first concavo-convex structure which is close to an edge of the display substrate; and a second planar extension portion connected to an end of the second concavo-convex structure which is close to an edge of the glass cover plate;

the first planar extension portion is extended to the edge of the display substrate, and the second planar extension portion is extended to the edge of the glass cover plate;

the first dense layer covers the first planar extension portion, and the second dense layer covers the second planar extension portion; the surface of the sealing layer is connected to the first dense layer, and the opposite surface of the sealing layer is connected to the second dense layer.

In some embodiments, the encapsulating portion further includes a supporting portion located on a side of the sealing layer which is away from the encapsulant material, and a surface of the supporting portion which faces the display substrate is connected to the first dense layer, a surface of the supporting portion which is away from the display substrate is connected to the second dense layer.

In some embodiments, materials of the sealing layer, the first dense layer and the second dense layer are the same.

In some embodiments, the materials of the first dense layer and the second dense layer are metal materials.

In some embodiments, the materials of the first concavo-convex structure and the second concavo-convex structure are organic resins.

In some embodiments, the organic resins are polyamide resins, polyacryl resins, or phenolic resins.

Some embodiments of the present disclosure provide a method of manufacturing the encapsulating structure of the OLED display panel, which includes:

providing a display substrate including OLED elements;

forming a first concavo-convex structure on a non-display area of the display substrate;

providing a glass cover plate opposite to the display substrate, and forming a second concavo-convex structure on a portion of the glass cover plate which is corresponding to the first concavo-convex structure;

filling an encapsulant material between the first concavo-convex structure and the second concavo-convex structure, so that an encapsulating portion is constituted by the first concavo-convex structure, the second concavo-convex structure, and the encapsulant material, and the OLED elements are located in a sealed chamber surrounded by the display substrate, the glass cover plate and the encapsulating portion, so as to obtain the encapsulating structure of the OLED display panel.

In some embodiments, the method further includes: after forming the first concavo-convex structure on the non-display area of the display substrate, and before filling the encapsulant material between the first concavo-convex structure and the second concavo-convex structure, forming a first dense layer on a surface of the first concavo-convex structure; and after forming the second concavo-convex structure on the portion of the glass cover plate which is corresponding to the first concavo-convex structure, and before filling the encapsulant material between the first concavo-convex structure and the second concavo-convex structure, forming a second dense layer on a surface of the second concavo-convex structure.

In some embodiments, the method further includes: after filling the encapsulant material between the first concavo-convex structure and the second concavo-convex structure, forming a sealing layer for sealing the encapsulant material on a side of the encapsulant material which is away from the OLED elements.

In some embodiments, the method further includes:

when forming the first concavo-convex structure on the non-display area of the display substrate, forming a first planar extension portion connected to an end of the first concavo-convex structure which is close to an edge of the display substrate; and when forming the first concavo-convex structure on the non-display area of the display substrate, forming a second planar extension portion connected to an end of the second concavo-convex structure which is close to an edge of the the glass cover plate.

In some embodiments, after forming a sealing layer for sealing the encapsulant material on a side of the encapsulant material which is away from the OLED elements, forming a supporting portion on a side of the sealing layer which is away from the encapsulant material.

Some embodiments of the present disclosure provide a display device, and the display device includes the encapsulating structure of the OLED display panel provided by the above embodiments.

BRIEF DESCRIPTION OF THE DRAWINGS

The drawings described herein are used to provide a further understanding of the present disclosure and constitute a part of the present disclosure. The illustrative embodiments of the present disclosure and the description thereof are for explaining the present disclosure and do not constitute an unsuitable limitation of the present disclosure. In the accompanying drawings.

DETAILED DESCRIPTION

A detailed description is made below with reference to accompanying drawings to further describe an encapsulating structure of an OLED display panel and a method of manufacturing the same, and a display device provided by embodiments of the present disclosure.

In the related art, the OLED elements are encapsulated by a laser frit encapsulation process. The laser frit encapsulation process means that glass retaining walls are provided between a display substrate and a glass cover plate which are opposite to each other, and the display substrate and the glass cover plate are supported and sealed by the glass retaining walls, thereby obtaining the encapsulating structure of the OLED display panel of laser glass. Since the display substrate includes OLED elements, and the OLED elements are located in a sealed chamber surrounded by the display substrate, the glass cover plate and the glass retaining walls, in the encapsulating structure of the OLED display panel of laser glass, the display substrate, the glass cover plate and the glass retaining walls constituting the sealed chamber prevent external water, oxygen and so on from penetrating into the sealed chamber, so that the OLED elements located in the sealed chamber are protected from being eroded by external water, oxygen and so on.

However, the glass retaining walls are easily broken when being subjected to external pressure, which makes the encapsulating structure of the OLED display panel of laser glass difficulty bear larger pressure. At the same time, since the aging problem of materials used for the glass retaining walls becomes more and more severe over time, so that the adhesion between the glass retaining walls and the display substrate, and the adhesion between the glass retaining walls and the glass cover plate are both reduced, cracks are likely to occur between the retaining walls and the display substrate, and/or between the glass retaining walls and the glass cover plate. If the cracks occur between the glass retaining walls and the display substrate, and/or between the glass retaining walls and the cover plate, external water, oxygen and so on may penetrate into the sealed chamber, which causes the OLED elements to be eroded by external water, oxygen and so on, thereby affecting useful life of OLED elements.

Figure 1:
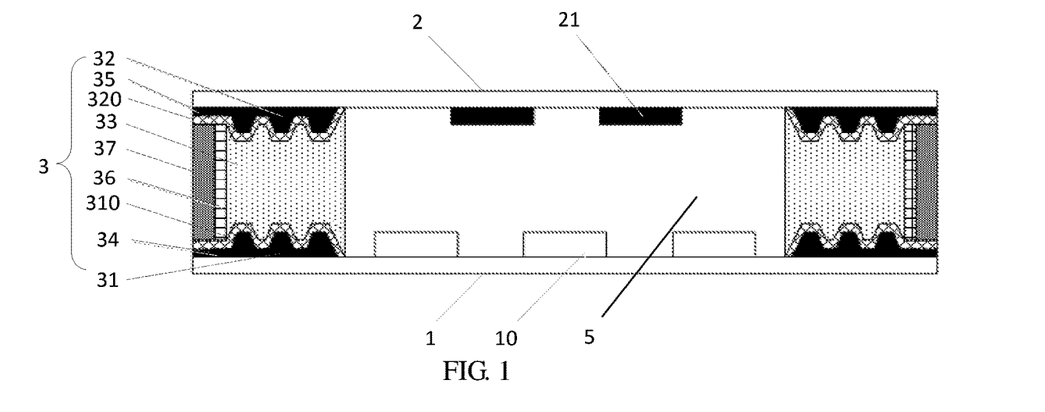
FIG. 1 is a schematic diagram showing an encapsulating structure of an OLED display panel according to some embodiments of the present disclosure.

In view of above problems, some embodiments of the present disclosure provide an encapsulating structure of an OLED display panel. Referring to FIG. 1, the encapsulating structure of the OLED display panel includes an encapsulating portion 3, as well as a display substrate 1 and a glass cover plate 2 which are opposite to each other. The encapsulating portion 3 is disposed between a non-display area of the display substrate 1 and a portion of the glass cover plate 2 which is corresponding to the non-display area. The display substrate 1 includes OLED elements 10. The OLED elements 10 are located in a sealed chamber 5 surrounded by the display substrate 1, the glass cover plate 2, and the encapsulating portion 3.

The encapsulating portion 3 includes a first concavo-convex structure 31, a second concavo-convex structure 32, and an encapsulant material 33. The first concavo-convex structure 31 is disposed on a surface of the display substrate 1 which faces the glass cover plate 2. The second concavo-convex structure 32 is disposed on a surface of the glass cover plate 2 which faces the display substrate 1. The encapsulant material 33 is disposed between the first concavo-convex structure 31 and the second concavo-convex structure 32.

In the encapsulating structure of the OLED display panel, the first concavo-convex structure 31 is disposed on the non-display area of the display substrate 1, and the second concavo-convex structure 32 is disposed on the portion of the glass cover plate 2 which is corresponding to the non-display area. Since a surface of the first concavo-convex structure 31 and a surface of the second concavo-convex structure 32 are both concavo-convex surfaces, and the encapsulant material 33 is filled between the first concavo-convex structure 31 and the second concavo-convex structure 32, so, relative to a contact area between a plate structure per unit area and the encapsulant material 33, a contact area between the first concavo-convex structure 31 per unit area and the encapsulant material 33 is larger, as well as a contact area between the second concavo-convex structure 32 per unit area and the encapsulant material 33 is aslo larger, which enhances the adhesion reliability between the encapsulant material 33 and the first concavo-convex structure 31, as well as the adhesion reliability between the encapsulant material 33 and the second concavo-convex structure 32. Therefore, the external water, oxygen and so on are effectively blocked from penetrating into the sealed chamber 5, thereby prolonging the useful lives of the OLED elements 10.

The above-mentioned encapsulant material 33 is, for example, a material having an encapsulating property such as ultraviolet rays adhesive (referred briefly to as UV adhesive) or epoxy resin. In some embodiments, materials of the first concavo-convex structure 31 and/or of the second concavo-convex structure 32 are organic resins which include polyamide resins, polyacryl resins, or phenolic resins. For example, polyethylene terephthalate (referred briefly to as PET), polybutylene terephthalate (referred briefly to as PBT) or polybutylene naphthalate (referred briefly to as PBN), and so on.

When the first concavo-convex structure 31 and the second concavo-convex structure 32 are manufactured, the first concavo-convex structure 31 and the second concavo-convex structure 32 are manufactured into various structures by utilizing characteristics of the organic resins which are easy molding. In some examples, a cross-sectional shape of the first concavo-convex structure 31 is saw-toothed in a direction perpendicular to a plate surface of the display substrate 1. In this way, a molding of the first concavo-convex structure 31 is facilitated. In some other examples, the cross-sectional shape of the first concavo-convex structure 31 is wavy or other irregular concavo-convex shape in the direction perpendicular to the plate surface of the display substrate 1. In some examples, a cross-sectional shape of the second concavo-convex structure 32 is saw-toothed in a direction perpendicular to a plate surface of the glass cover plate 2. In this way, a molding of the second concavo-convex structure 32 is facilitated. In some other examples, the cross-sectional shape of the second concavo-convex structure 32 is wavy or other irregular concavo-convex shape. In some examples, the cross-sectional shape of the first concavo-convex structure 31 and the cross-sectional shape of the second concavo-convex structure 32 are the same. In some other examples, the cross-sectional shape of the first concavo-convex structure 31 and the cross-sectional shape of the second concavo-convex structure 32 are different.

In some embodiments, as shown in FIG. 1, an orthographic projection of the first concavo-convex structure 31 on the glass cover plate 2 and an orthographic projection of the second concavo-convex structure 32 on the glass cover 2 are at least partially overlapped.

In some embodiments, as shown in FIG. 1, the orthographic projection of the first concavo-convex structure 31 on the glass cover plate 2 and the orthographic projection of the second concavo-convex structure 32 on the glass cover plate 2 are completely overlapped. The encapsulant material 33 between the first concavo-convex structure 31 and the second concavo-convex structure 32 is evenly forced.

In some embodiments, continuing with reference to FIG. 1, a black matrix layer 21 is disposed on a surface of the glass cover plate 2 which faces the display substrate 1. In some embodiments, continuing with reference to FIG. 1, in order to simplify manufacturing processes of the encapsulating structure of the OLED display panel, the second concavo-convex structure 32 and the black matrix layer 21 are disposed on a same layer. When the black matrix layer 21 and the second concavo-convex structure 32 are disposed on the same layer, if a material of the black matrix layer 21 and a material of the second concavo-convex structure 32 are both black matrix materials, then the black matrix materials are deposited on the surface of the glass cover plate 2 which faces the display substrate 1, and next the black matrix layer 21 and the second concavo-convex structure 32 are manufactured simultaneously by a one-time patterning process such as a halftone mask and the like, so as to reduce manufacturing steps of the encapsulating structure of the OLED display panel, thereby improving a manufacturing efficiency of the encapsulating structure of the OLED display panel.

In some embodiments, the display substrate 1 includes not only an array of organic electroluminescent elements composed of a plurality of organic electroluminescent elements, but also an array of thin film transistors composed of a plurality of thin film transistors. Each organic electroluminescent element in the array of organic electroluminescent elements is spaced apart by a pixel-defining layer. In some embodiments, the first concavo-convex structure 31 and a gate insulating layer of the thin film transistors included in the array of the thin film transistors are disposed on a same layer. In some embodiments, the first concavo-convex structure 31 and the pixel-defining layer are disposed on a same layer. Since the material of the first concavo-convex structure 31 is organic resin, as well as the pixel-defining layer, and the gate insulating layer of the thin film transistors included in the array of the thin film transistor are both made of organic resins, when the pixel-defining layer or the gate insulating layer is manufactured, the first concavo-convex structure 31 is simultaneously formed by the one-time patterning process such as the halftone mask and the like, thereby further improving the manufacturing efficiency of the encapsulating structure of the OLED display panel. In some embodiments, the second concavo-convex structure 32 and the glass cover plate 2 are simultaneously molded, so that the manufacturing efficiency of the encapsulating structure of the OLED display panel may be further improved.

In some embodiments, continuing with reference to FIG. 1, in order to further improve the sealing reliability of the encapsulating structure of the OLED display panel, the encapsulating portion 3 further includes a first dense layer 310 disposed between the first concavo-convex structure 31 and the encapsulant material 33, and a second dense layer 320 disposed between the second concavo-convex structure 32 and the encapsulant material 33. Due to a tightness that the first dense layer 310 is connected to both the first concavo-convex structure 31 and the encapsulant material 33, and a tightness that the second dense layer 320 is connected to both the second concavo-convex structure 32 and the encapsulant material 33 are both high, the sealing reliability of the encapsulating structure of the OLED display panel is further improved.

It should be noted that the material of the first dense layer 310 and/or the material of the second dense layer 320 satisfy requirements of high compactness and chemical inertness, so that the tightness that the first dense layer 310 is connected to both the first concavo-convex structure 31 and the encapsulant material 33, and the tightness that the second dense layer 320 is connected to both the second concavo-convex structure 32 and the encapsulant material 33 are both high.

In some embodiments, the material of the first dense layer 310 and/or the material of the second dense layer 320 are metal materials. Seen from a perspective of micro-level, metal materials are formed by an accumulation of metal atoms. It should be noted that when the material of the first dense layer 310 and/or the material of the second dense layer 320 are metal materials, the tightness that the first dense layer 310 is connected to both the first concavo-convex structure 31 and the encapsulant material 33, and the tightness that the second dense layer 320 is connected to both the second concavo-convex structure 32 and the encapsulant material 33 are both high. At the same time, the first dense layer 310 and/or the second dense layer 320 also have good structural strength.

In some embodiments, the material of the first dense layer 310 and/or the material of the second dense layer 320 are inorganic materials having high density and stability.

In some embodiments, continuing with reference to FIG. 1, in order to further improve the sealing reliability of the encapsulating structure of the OLED display panel, the encapsulating portion 3 further includes an sealing layer 36 for encapsulating the above encapsulant material 33. The sealing layer 36 is located a surface of the encapsulant material 33 which is away from the sealed chamber 5. One surface of the sealing layer 36 is connected to the first dense layer 310, and an opposite surface of the sealing layer 36 is connected to the second dense layer 320. In this way, the encapsulant material 33 may be isolated from the outside by the sealing layer 36, which avoids the contact of the encapsulant material 33 with the outside, thereby further improving the sealing reliability of the encapsulating structure of the OLED display panel.

In some embodiments, as shown in FIG. 1, the encapsulating portion 3 further includes a first planar extension portion 34 and a second planar extension portion 35. The first planar extension portion 34 is connected to an end of the first concavo-convex structure 31 which is close to an edge of the display substrate 1. The first planar extension portion 34 is extended to the edge of the display substrate 1. The first dense layer 310 covers the first planar extension portion 34. The second planar extension portion 35 is connected to an end of the second concavo-convex structure 32 which is close to an edge of the glass cover plate 2. The second planar extension portion 35 is extended to the edge of the glass cover plate 2. The second dense layer 320 covers the second planar extension portion 35. A surface of the sealing layer 36 which faces the display substrate 1 is connected to the first dense layer 310. A surface of the sealing layer 36 which is away from the display substrate 1 is connected to the second dense layer 320.

When the material of the first dense layer 310 and the material of the second dense layer 320 are both metal materials, the first dense layer 310 is also formed on a surface of the first planar extension portion 34, and the second dense layer 320 is further formed on a surface of the second planar extension portion 35. In some embodiments, the display substrate 1 includes metal traces disposed in the non-display area, and the first dense layer 310 and the metal traces of the display substrate 1 are simultaneously manufactured in one-time patterning process, thereby simplifying manufacturing processes of the encapsulating structure of the display of the OLED display panel. It should be noted that the metal traces of the display substrate 1 are insulated from the first dense layer 310 to prevent electrical charges in the first dense layer 310 from influencing the stability of the material of the first concavo-convex structure 31 when the first dense layer 310 is charged.

To ensure a sealing performance between the sealing layer 36 and the first dense layer 310, and a sealing performance between the sealing layer 36 and the second dense layer 320, in some embodiments, the material of the sealing layer 36, the material of the first dense layer 310 and the material of second dense layer 320 are the same. As such, at a junction of the sealing layer 36 and the first dense layer 310, and a junction of the sealing layer 36 and the second dense layer 320, the sealing layer 36 may be in good fused together with the first dense layer 310 and the second dense layer 320, so that good seals between the sealing layer 36 and the first dense layer 310, as well as between the sealing layer 36 and the second dense layer 320 may be ensured.

In some embodiments, the material of the first dense layer 310 and/or the material of the second dense layer 320 are aluminum or copper. In some embodiments, the material of the sealing layer 36 is aluminum or copper. Since the copper has good chemical inertness and good compactness, the sealing layer 36, the first dense layer 310 and the second dense layer 320 are not easily oxidized or damaged by water, oxygen or the like, so that the first dense layer 310, the sealing layer 36 and the second dense layer 320 further protect the encapsulant material 33 from being eroded by external water and oxygen. In addition, an aluminum oxide film formed through oxidation of aluminum has better compactness and stability, thereby causing the first dense layer 310, the sealing layer 36 and the second dense layer 320 to still able to protect the encapsulant material 33 even if being eroded by external water and oxygen.

In order to enhance the structural stability of the encapsulating structure of the OLED display panel, continuing with reference to FIG. 1, in some embodiments, the encapsulating portion 3 further includes a supporting portion 37 on a side of the sealing layer 36 which is away form the encapsulant material 33. One surface of the supporting portion 37 which faces the display substrate 1 is connected to the first dense layer 310, and another one surface of the supporting portion 37 which is away from the display substrate 1 is connected to the second dense layer 320.

With this arrangement, the first dense layer 310 and the second dense layer 320 may be supported by the supporting portion 37 while the sealing layer 36, the first dense layer 310 and the second dense layer 320 are protected by the supporting portion 37, thereby increasing stability of a space surrounded by the first dense layer 310, the sealing layer 36 and the second dense layer 320. When the encapsulating structure of the OLED display panel is subjected to external pressure, the supporting portion 37 provides support to the first dense layer 310 and the second dense layer 320, which may effectively cancel or buffer the external pressure, and prevent the encapsulating structure of the OLED display panel from being deformed or damaged due to the external pressure.

In some embodiments, a material of the supporting portion 37 is a colloid having adhesion and support properties such as a room temperature vulcanized silicone rubber (RTV), a photoresist and so on.

In some embodiments, the first concavo-convex structure 31 is integrally molded with the display substrate 1, such that there is no problem whether the seal is reliable between the first concavo-convex structure 31 and the display substrate 1. In some embodiments, the second concavo-convex structure 32 is integrally molded with the glass cover plate 2, such that there is no problem whether the seal is reliable between the second concavo-convex structure 32 and the glass cover plate 2. In summary, the reliability that the encapsulant material 33 is in contact with both the first concavo-convex structure 31 and the second concavo-convex structure 32 may be improved, so that the encapsulant material 33 has good reliability for encapsulations of the display substrate 1 and the glass cover plate 2.

Figure 2:
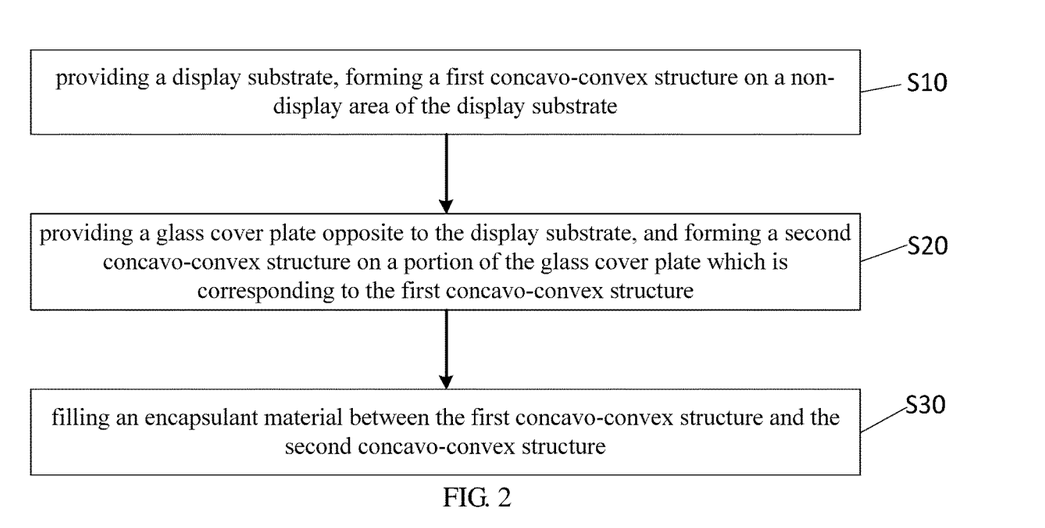
FIG. 2 is a flow chart of a method of manufacturing the encapsulating structure of the OLED display panel according to some embodiments of the present disclosure.

Some embodiments of the present disclosure provide a method of manufacturing an encapsulating structure of an OLED display panel, which is used for manufacturing the encapsulating structure of the OLED display panel in the above embodiments. Referring to FIG. 2, the method of manufacturing the encapsulating structure of the OLED display panel includes steps 10-30 (S10-S30). Step 10 (S10) and step 20 (S20) are performed simultaneously or sequentially.

S10, providing a display substrate 1, and forming a first concavo-convex structure 31 on a non-display area of the display substrate 1. The display substrate 1 includes OLED elements 10.

S20, providing a glass cover plate 2 opposite to the display substrate 1, forming a second concavo-convex structure 32 on a portion of the glass cover plate 2 which is corresponding to the first concavo-convex structure 31.

S30, filling an encapsulant material 33 between the first concavo-convex structure 31 and the second concavo-convex structure 32, so that the first concavo-convex structure 31, the second concavo-convex structure 32, and the encapsulant material 33 together constitute a encapsulating portion 3. The above OLED elements 10 are located in a sealed chamber 5 surrounded by the display substrate 1, the glass cover plate 2, and the encapsulating portion 3, so as to obtain the encapsulating structure of the OLED display panel.

Beneficial effects that can be achieved by the method of manufacturing the encapsulating structure of the OLED display panel provided by the embodiments of the present disclosure are the same as those of the encapsulating structure of the OLED display panel provided by the above embodiments, and are not described herein.

In some embodiments, the second concavo-convex structure 32 and the black matrix layer 21 of the glass cover plate 2 are manufactured in a same layer. For example, the second concavo-convex structure 32 and the black matrix layer 21 are formed by the halftone mask through the one-time patterning process. This arrangement may simplify the manufacturing process of the encapsulating structure of the OLED display panel, thereby improving the manufacturing efficiency of the encapsulating structure of the OLED display panel.

In some embodiments, the material of the first concavo-convex structure 31 and/or the material of the second concavo-convex structure 32 are organic resins. For example, when a film layer such as a pixel defining layer or a passivation layer is formed by the organic resin in the display substrate of OLED, the first concavo-convex structure 31 and the pixel defining layer are formed by the halftone mask in the one-time patterning process, or the first concavo-convex structure 31 and the passivation layer are formed through the halftone mask in the one-time patterning process. In some embodiments, the second concavo-convex structure 32 and the glass cover plate 2 are formed by the halftone mask in the one-time patterning process, so that the manufacturing processes of the encapsulating structure of the OLED display panel may be further simplified, and the manufacturing efficiency of the encapsulating structure of the OLED display panel may be further improved.

Figure 3:
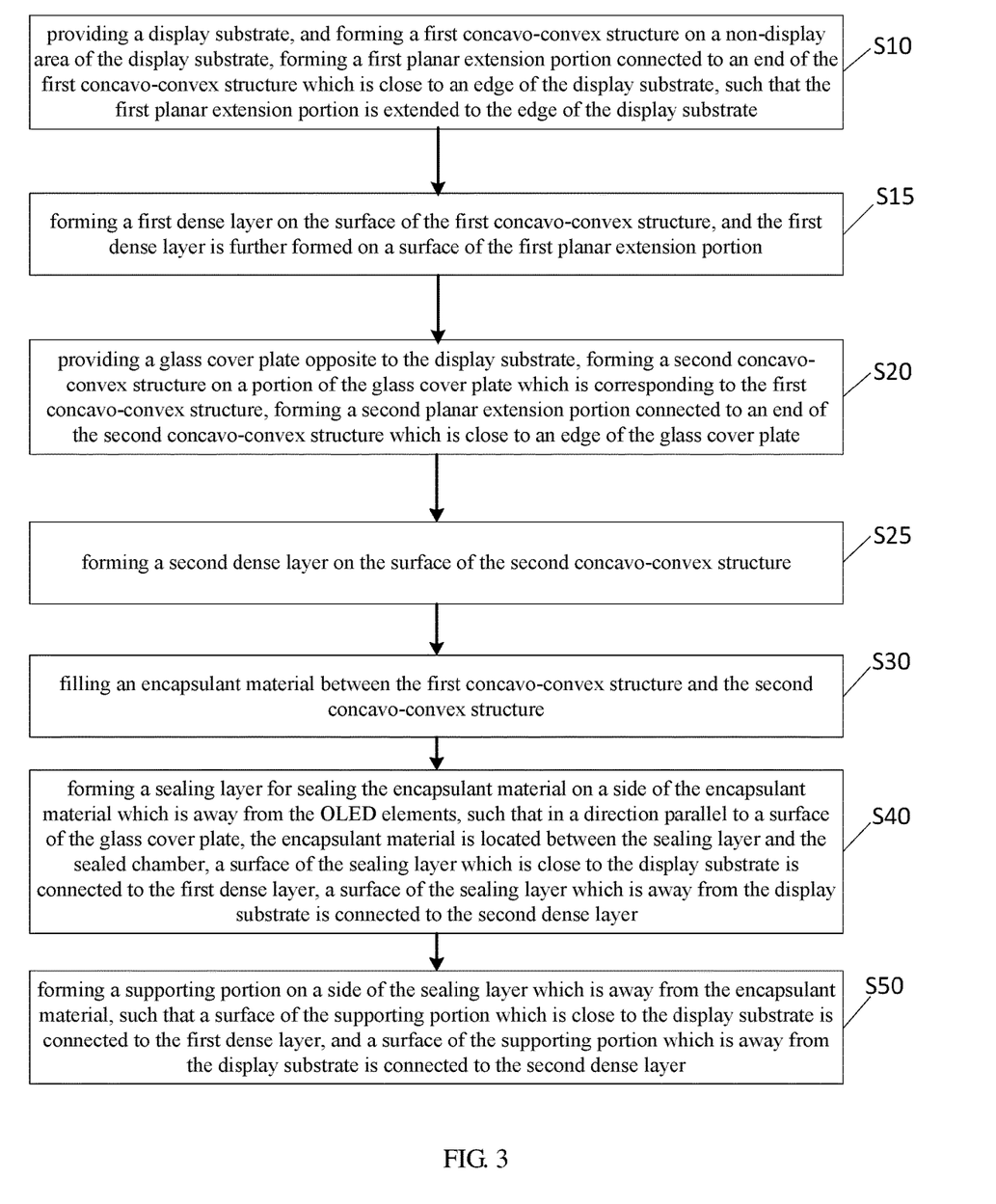
FIG. 3 is another flow chart of a method of manufacturing the encapsulating structure of OLED display panel according to some embodiments of the present disclosure.

In some embodiments, as shown in FIGS. 1 and 3, after forming the first concavo-convex structure 31 on the non-display area of the display substrate 1, and before filling the encapsulant material 33 between the first concavo-convex structure 31 and the second concavo-convex structure 32, the method of manufacturing the encapsulating structure of the OLED display panel further includes a step 15 (S15):

S15, forming a first dense layer 310 on the surface of the first concavo-convex structure 31, such that the first dense layer 310 is located between the first concavo-convex structure 31 and the encapsulant material 33.

After forming the first concavo-convex structure 31 on the surface of the glass cover plate 2 which is corresponding to the first concavo-convex structure 31, and before forming the encapsulant material 33 between the first concavo-convex structure 31 and the second concavo-convex structure 32, the method of manufacturing the encapsulating structure of the OLED display panel further includes a step 25 (S25):

S25, forming a second dense layer 320 on the surface of the second concavo-convex structure 32, such that the second dense layer 320 is located between the second concavo-convex structure 32 and the encapsulant material 33.

In some embodiments, as shown in FIGS. 1 and 3, after forming the encapsulant material 33 between the first concavo-convex structure 31 and the second concavo-convex structure 32, the method of manufacturing the encapsulating structure of the OLED display panel further includes a step 40 (S40):

S40, forming a sealing layer 36 on a side of the encapsulant material 33 which is away from the OLED elements 10, such that in a direction parallel to a surface of the glass cover plate 2, the encapsulant material 33 is located between the sealing layer 36 and the sealed chamber 5.

In some embodiments, as shown in FIGS. 1 and 3, when the first concavo-convex structure 31 is formed on the non-display area of the display substrate 1, the S10 that is included in the method of manufacturing the encapsulating structure of the OLED display panel further includes:

forming a first planar extension portion 34 connected to an end of the first concavo-convex structure 31 which is close to an edge of the display substrate 1, such that the first planar extension portion 34 is extended to the edge of the display substrate 1, the first dense layer 310 is further formed on a surface of the first planar extension portion 34, and a surface of the sealing layer 36 which is close to the display substrate 1 is connected to the first dense layer 310.

When the first concavo-convex structure 31 is formed on the non-display area of the display substrate 1, the S20 that is included in the method of manufacturing the encapsulating structure of the OLED display panel further includes:

forming a second planar extension portion 35 connected to an end portion of the second concavo-convex structure 32 which is close to an edge of the glass cover plate 2. Such that the second planar extension portion 35 is extended to the edge of the cover glass plate 2, and the surface of the sealing layer 36 which is away from the display substrate 1 is connected to the second dense layer 320.

In some embodiments, as shown in FIG. 1, the OLED display substrate is provided with metal traces for connecting to a driving chip, as well as the first dense layer 310 and the metal traces are formed in the one-time patterning process. Such an arrangement may simplify the process of manufacturing the encapsulating structure of the OLED display panel. It should be noted that the first dense layer is insulated from the metal traces.

In some embodiments, as shown in FIG. 3, after forming the sealing layer 36 for sealing the encapsulant material 33 on a side of the encapsulant material 33 which is away from the OLED elements 10, the method of manufacturing the encapsulating structure of the OLED display panel further includes a step 50 (S50):

S50, forming a supporting portion 37 on a side of the sealing layer 36 which is away from the encapsulant material 33, such that a surface of the supporting portion 37 which is close to the display substrate 1 is connected to the first dense layer 310, and a surface of the supporting portion 37 which is away from the display substrate 1 is connected to the second dense layer 320. For example, the supporting portion 37 is formed by coating a supporting adhesive.

The first dense layer and the second dense layer are supported by the supporting portion 37, which may enhance the stability of the space surrounded by the first dense layer, the sealing layer and the second dense layer, thereby enhancing stability of the encapsulating structure of the OLED display panel. When the encapsulating structure of the OLED display panel is subjected to external pressure, the supporting portion 37 provides support to the first dense layer and the second dense layer, which may effectively cancel or buffer the external pressure, and prevent the encapsulating structure of the OLED display panel from being deformed or damaged due to the external pressure.

In some embodiments, a material of the supporting adhesive is a room temperature vulcanized silicone rubber (briefly referred to as RTV adhesive). RTV adhesive has characteristics of a long storage life and stability. Therefore, after the RTV adhesive is coated on a side of the sealing layer which is away from the encapsulant material, the first dense layer, the sealing layer and the second dense layer may be better adhered and supported by the RTV adhesive that is cured, thereby enhancing the stability of the encapsulating structure of the OLED display panel. Of course, the material of the supporting adhesive is not limited to this, but it can also be other supporting adhesives that may have both adhesive and supporting properties.

Figure 4:
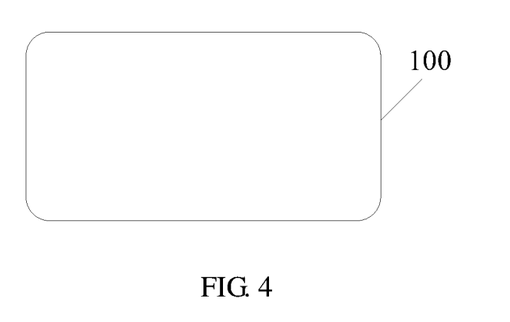
FIG. 4 is a schematic diagram of a display device according to some embodiments of the present disclosure.

As shown in FIG. 4, some embodiments of the present disclosure provide a display device 100, which includes the encapsulating structure of the OLED display panel as described in above embodiments. The encapsulating structure of the OLED display panel of the display device 100 has the same advantages as the encapsulating structure of the OLED display panel provided by above embodiments, and are not described herein again.

Moreover, the display device may be, for example, a mobile phone, a tablet computer, a television, a display, a notebook computer, a digital photo frame, a navigator, or any other product or component having a display function.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An encapsulating structure of an organic light emitting diode display panel, comprising a display substrate and a glass cover plate opposite to each other, and an encapsulating portion disposed between a non-display area of the display substrate and a portion of the glass cover plate which is corresponding to the non-display area, wherein
   the display substrate comprises organic light emitting diode elements, the organic light emitting diode elements are located in a sealed chamber surrounded by the display substrate, the glass cover plate, and the encapsulating portion;
   the encapsulating portion comprises:
   a first concavo-convex structure disposed on a surface of the display substrate which faces the glass cover plate;
   a second concavo-convex structure disposed on a surface of the glass cover plate which faces the display substrate;
   an encapsulant material disposed between the first concavo-convex structure and the second concavo-convex structure;
   a first dense layer disposed between the first concavo-convex structure and the encapsulant material; and
   a second dense layer disposed between the second concavo-convex structure and the encapsulant material;
   wherein the first concavo-convex structure, the encapsulant material and the second concavo-convex structure are disposed in sequence in a direction perpendicular to a plate surface of the display substrate.

2. The encapsulating structure of the organic light emitting diode display panel according to claim 1, wherein, a dark matrix layer is disposed on the surface of the glass cover plate which faces the display panel, and the second concavo-convex structure and the dark matrix layer are disposed in a same layer.

3. The encapsulating structure of the organic light emitting diode display panel according to claim 1, wherein, a cross-sectional shape of the first concavo-convex structure is saw-toothed in a direction perpendicular to a plate surface of the display substrate; and/or
   a cross-sectional shape of the second concavo-convex structure is saw-toothed in a direction perpendicular to a plate surface of the glass cover plate.

4. The encapsulating structure of the organic light emitting diode display panel according to claim 1, wherein, an orthographic projection on the glass cover plate of the first concavo-convex structure plate and an orthographic projection on the glass cover plate of the second concavo-convex structure are at least partially overlapped.

5. The encapsulating structure of the organic light emitting diode display panel according to claim 1, wherein, the encapsulating portion further comprises a sealing layer disposed on a surface of the encapsulant material which is away from the sealed chamber and configured to seal the encapsulant material, a surface of the sealing layer is connected to the first dense layer, and an opposite surface of the sealing layer is connected to the second dense layer.

6. The encapsulating structure of the organic light emitting diode display panel according to claim 5, wherein, the encapsulating portion further comprises:

a first planar extension portion connected to an end of the first concavo-convex structure which is close to an edge of the display substrate; and a second planar extension portion connected to an end of the second concavo-convex structure which is close to an edge of the glass cover plate;

the first planar extension portion is extended to the edge of the display substrate, and the second planar extension portion is extended to the edge of the glass cover plate;

the first dense layer covers the first planar extension portion, and the second dense layer covers the second planar extension portion; the surface of the sealing layer is connected to the first dense layer, and the opposite surface of the sealing layer is connected to the second dense layer.

7. The encapsulating structure of the organic light emitting diode display panel according to claim 6, wherein, the encapsulating portion further comprises a supporting portion located on a side of the sealing layer which is away from the encapsulant material, and a surface of the supporting portion which faces the display substrate is connected to the first dense layer, a surface of the supporting portion which is away from the display substrate is connected to the second dense layer.

8. The encapsulating structure of the organic light emitting diode display panel according to claim 5, wherein, materials of the sealing layer, the first dense layer and the second dense layer are the same.

9. The encapsulating structure of the organic light emitting diode display panel according to claim 8, wherein, the materials of the first dense layer and the second dense layer are metal materials.

10. The encapsulating structure of the organic light emitting diode display panel according to claim 1, wherein, materials of the first concavo-convex structure and the second concavo-convex structure are organic resins.

11. The encapsulating structure of the organic light emitting diode display panel according to claim 10, wherein, the organic resins are polyamide resins, polyacrylic resins or phenolic resins.

12. A display device comprising the encapsulating structure of the organic light emitting diode display panel according to claim 1.

13. A method of manufacturing the encapsulating structure of the organic light emitting diode display panel according to claim 1, comprising:

providing a display substrate comprising organic light emitting diode elements;

forming a first concavo-convex structure on a non-display area of the display substrate;

providing a glass cover plate opposite to the display substrate, and forming a second concavo-convex structure on a portion of the glass cover plate which is corresponding to the first concavo-convex structure;

filling an encapsulant material between the first concavo-convex structure and the second concavo-convex structure, so that an encapsulating portion is constituted by the first concavo-convex structure, the second concavo-convex structure, and the encapsulant material, wherein the first concavo-convex structure, the encapsulant material and the second concavo-convex structure are disposed in sequence in a direction perpendicular to a plate surface of the display substrate, the organic light emitting diode elements are located in a sealed chamber surrounded by the display substrate, the glass cover plate and the encapsulating portion, so as to obtain the encapsulating structure of the organic light emitting diode display panel;

after forming the first concavo-convex structure on the non-display area of the display substrate, and before filling the encapsulant material between the first concavo-convex structure and the second concavo-convex structure, forming a first dense layer on a surface of the first concavo-convex structure; and after forming the second concavo-convex structure on the portion of the glass cover plate which is corresponding to the first concavo-convex structure, and before filling the encapsulant material between the first concavo-convex structure and the second concavo-convex structure, forming a second dense layer on a surface of the second concavo-convex structure.

14. The method according to claim 13, wherein the method further comprises: after filling the encapsulant material between the first concavo-convex structure and the second concavo-convex structure, forming a sealing layer for sealing the encapsulant material on a side of the encapsulant material which is away from the organic light-emitting diode elements.

15. The method according to claim 14, wherein the method further comprises:

when forming the first concavo-convex structure on the non-display area of the display substrate, forming a first planar extension portion connected to an end of the first concavo-convex structure which is close to an edge of the display substrate; and when forming the first concavo-convex structure on the non-display area of the display substrate, forming a second planar extension portion connected to an end of the second concavo-convex structure which is close to an edge of the glass cover plate.

16. The method according to claim 14, wherein the method further comprises: after forming the sealing layer on the side of the encapsulant material which is away from the organic light-emitting diode elements, forming a supporting portion on a side of the sealing layer which is away from the encapsulant material.

* * * * *